United States Patent [19]

Tsuya et al.

[11] 4,363,769
[45] Dec. 14, 1982

[54] METHOD FOR MANUFACTURING THIN AND FLEXIBLE RIBBON WAFER OF SEMICONDUCTOR MATERIAL AND RIBBON WAFER

[75] Inventors: Noboru Tsuya, 1-38, Kashiwagi 2-Chome, Sendai City, Japan; Kenichi Arai, Sendai, Japan

[73] Assignee: Noboru Tsuya, Sendai, Japan

[21] Appl. No.: 225,242

[22] Filed: Jan. 15, 1981

Related U.S. Application Data

[63] Continuation of Ser. No. 961,047, Nov. 15, 1978, abandoned.

[30] Foreign Application Priority Data

Nov. 23, 1977 [JP] Japan ............................... 52-140103

[51] Int. Cl.$^3$ .............................................. B29D 7/02
[52] U.S. Cl. ........................................ 264/85; 264/212; 264/332
[58] Field of Search .................... 961/47; 264/212, 12, 264/332, 85

[56] References Cited

U.S. PATENT DOCUMENTS

| | | | |
|---|---|---|---|
| 1,756,196 | 4/1930 | Hopkins et al. | 164/480 |
| 1,867,818 | 7/1932 | Freeland | 148/111 |
| 3,381,739 | 5/1968 | Hart | 164/64 |
| 3,663,767 | 5/1972 | Shimotori et al. | 179/100 |
| 3,748,728 | 7/1973 | Watson | 29/599 |
| 3,812,226 | 5/1974 | De Bussy | 264/6 |
| 3,837,827 | 9/1974 | Carruthers et al. | 65/30 |
| 3,896,203 | 7/1975 | Maringer et al. | 264/165 |
| 4,000,014 | 12/1976 | Winter | 148/11.5 R |
| 4,049,522 | 9/1977 | Ainslie et al. | 204/192 |
| 4,065,330 | 12/1977 | Masumoto et al. | 148/31.55 |
| 4,079,430 | 3/1978 | Fujishima et al. | 360/126 |
| 4,146,391 | 5/1979 | Inoue et al. | 75/124 |
| 4,221,257 | 9/1980 | Narasimhan | 164/87 |
| 4,229,231 | 10/1980 | Witt et al. | 148/1.5 |

FOREIGN PATENT DOCUMENTS

51-138517 11/1976 Japan .

*Primary Examiner*—John A. Parrish
*Attorney, Agent, or Firm*—Fleit & Jacobson

[57] ABSTRACT

A method for manufacturing a thin and flexible ribbon wafer of semiconductor material such as germanium, silicon, selenium, tellurium, PbS, InSb, ZnTe, PbSe, InAs, InP, GaSb, PbTe, ZnS, Bi$_2$Te$_3$, and mixtures thereof comprises melting the semiconductor material at a temperature within the range from a melting point thereof to 300° C. above the melting point to form a uniform melt; ejecting under a pressure the melt through a nozzle against a cooling surface of a moving substrate to cool very rapidly a jet flow of the melt at a cooling rate of 1,000° C. to 1,000,000° C./sec to form the ribbon type thin and flexible wafer of fine and compact microscopic structure having a large mechanical strength and an excellent electrical property. It is possible to add to the melt various additives as fluxes or impurities such as B, P, BP, Sb Sn, As, B, P, Sb, In, Al and alloys intermetallic compounds, and conjugates thereof. The thin ribbon wafer as grown is preferably heated at a temperature from within the range 500° C. to the melting point for a time within the range from 0.1 second to one week. The invention also provides a thin and flexible ribbon wafer of semiconductor material manufactured by the above mentioned process.

25 Claims, 24 Drawing Figures

3e-1  3e-2

3f 3j-2   3j-1   3j-2

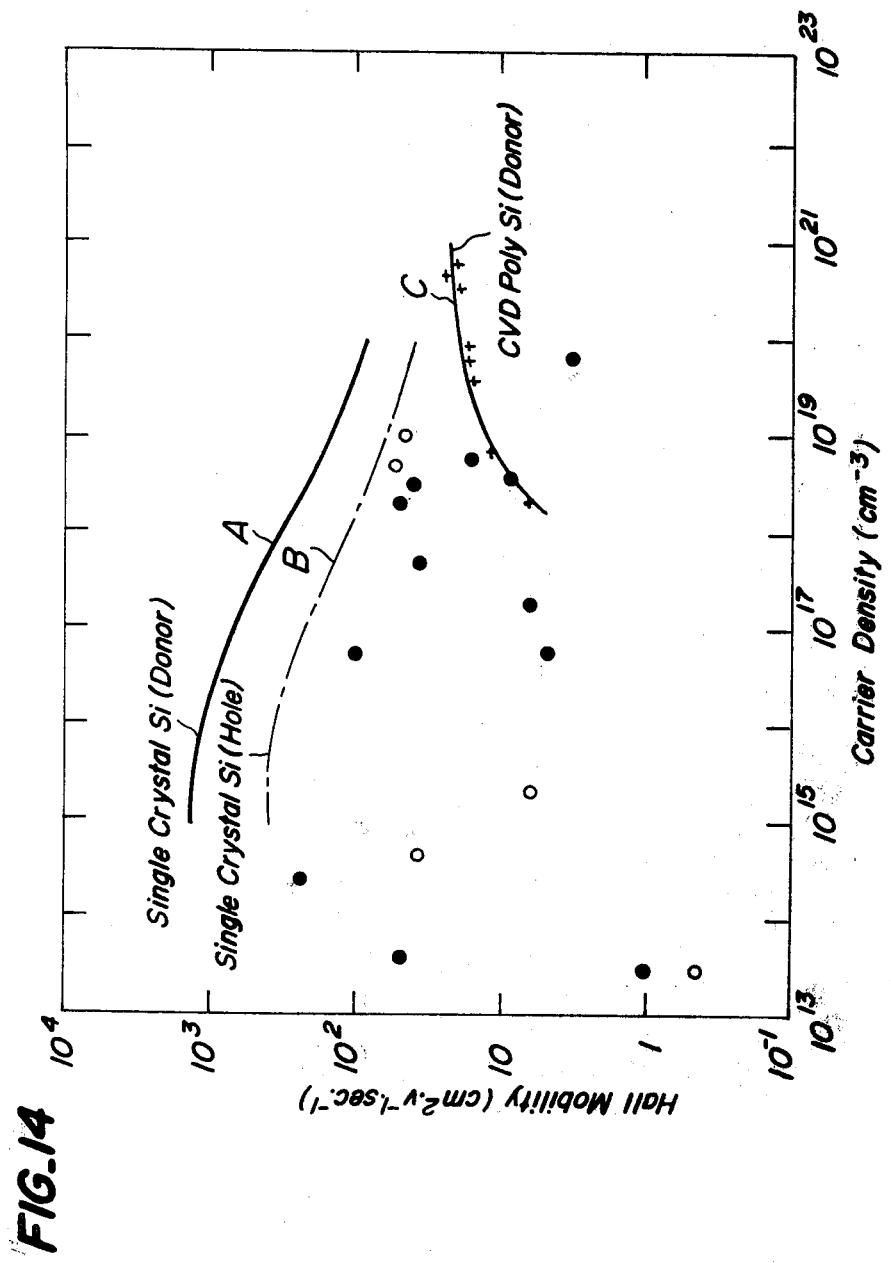

METHOD FOR MANUFACTURING THIN AND FLEXIBLE RIBBON WAFER OF SEMICONDUCTOR MATERIAL AND RIBBON WAFER

This is a continuation of application Ser. No. 961,047 filed Nov. 15, 1978, now abandoned.

BACKGROUND OF THE INVENTION

1. Field of the Invention

This invention relates to a method of manufacturing a ribbon type thin wafer of semiconductor material selected from the group consisting of germanium, silicon, selenium, tellurium, PbS, InSb, ZnTe, PbSe, InAs, CdS, GaAs, InP, GaSb, PbTe, ZnS, $Bi_2Te_3$, and mixtures thereof with additional elements for improving their properties, wherein said method comprises melting semiconductor material and rapid cooling the melt on the surface of travelling cooling substrate and forming a ribbon type thin wafer of semiconductor material having a fine and compact microscopic structure and homogeneous composition.

2. Description of the Prior Art

In the prior art, it is known that a thin plate of semiconductor such as selenium can be obtained by pressing the melt. Further, it is known that the polycrystalline silicon can be obtained on a substrate such as iron plate or stainless plate by the vapour deposition or glow-discharging. It is also known to obtain a thin film of single crystal silicon semiconductor material by taking up slowly from silicon melt. It is known in the prior art to produce the thin film by spattering or electrodepositing semiconductor material other than silicon on a substrate. However, it is unknown to produce at a high speed a thin wafer of semiconductor such as thin flake or thin ribbon which is not deposited on the substrate.

Accordingly, in the prior art, the producing speed of thin film of semiconductor was very low and it is very difficult to produce said thin film of semiconductor by industrial scale of mass production.

A very large scale of power station utilizing solar energy or numerous power sources of solar cells for use of air conditioning in individual houses should be realized for supporting the lack of future energy. While, in the prior art, the producing speed of thin wafer of semiconductor is too slow to produce a large scale of solar cell elements sufficient for supplying necessary energy lack. It is therefore highly requested to develop a high speed manufacturing method of a thin ribbon wafer of semiconductor material in a mass production.

SUMMARY OF THE INVENTION

An object of the present invention is to provide a method of manufacturing a thin ribbon wafer of semiconductor material having a fine microscopic structure of high density in a high speed, by melting semiconductor material, ejecting the melt of semiconductor material through a nozzle and quickly cooling said melt on a surface of a moving or rotating cooling substrate. The method of producing a thin ribbon wafer of semiconductor material according to the invention is of extremely higher speed than that of the prior art. The raw material of crystalline semiconductor is selected from single or polycrystal element such as silicon, germanium, selenium tellurium, and III-V Group compound semiconductor material such as GaAs, InSb, GaSb, InAs, InP, and II-VI Group compound semiconductor material such as CdS, ZnTe, ZnS and other compounds such as PbSe, PbTe, $Bi_2Te_3$ and mixtures thereof. According to the invention, various elements or compounds may be added in a melt of semiconductor material so as to produce a thin ribbon wafer of semiconductor having a fine and condensed microscopic structure in a solid solution.

According to the present invention, the ribbon thin wafer of semiconductor having a fine and compact microscopic structure may be obtained by quickly cooling the melt of a plurality of semiconductor elements such as Ge-Si which become a similar crystal structure in a solid solution over a wide range of mixing. A thin ribbon wafer of compound semiconductor having a fine and compact crystalline structure can be also obtained by quickly cooling the melt of a plurality of similar compounds of semiconductor material. As this example, ZnS-ZnTe can be illustrated.

As solid-soluble additive elements, use may be made of Sn, As, B, P, Sb, Al, Ga or composite clad material thereof.

As further additive elements, use may be made of metals and halogens which have been included in original semiconductor material.

The range of amount of these additive elements in the thin ribbon wafer of the semiconductor is considerably wider than the solubility limit in an ordinary crystalline state of the semiconductor.

In addition, all the additive elements soluble into the melt of semiconductor material are effective for changing electrical-, magnetic-, optical-, crystal structural- and elastic characteristics of the thin ribbon wafer of the semiconductor.

B, P, BP, SbAl, etc., are very effective as a flux as described hereinafter and serve to obtain the thin wafer of semiconductor. It is noted that B, P etc. are available to increase the viscosity of melt of semiconductor material.

In case of melting semiconductor material, attention should be given to the following points. That is, it is necessary to provide a sufficient viscosity for ejecting a melt of semiconductor material through a nozzle, and if a melting temperature becomes higher than a melting point of the semiconductor material, the viscosity becomes too low, so that the melt spontaneously drops out of the nozzle by the gravity and forms liquid drops. Further, if semiconductor material is molten at a much higher temperature, the melt continuously flows out of the nozzle and thus a thin ribbon wafer of semiconductor of good quality cannot be obtained. Accordingly, semiconductor material should be molten substantially at the melting point of material or at a higher temperature up to 300° C. above the melting point. In order to melt semiconductor material, use may be made of a resistance heating method and a high frequency heating method, but any other heating method may be employed.

The melt semiconductor material is ejected from the nozzle, and it is preferable to start this ejecting operation when the nozzle reaches immediately above a moving or rotating surface of moving or rotating cooling substrate. This can be controlled with the aid of a micro-switch and the like which detects a distance between the nozzle and the surface. Further, in order to obtain a semiconductor thin ribbon wafer of good quality, the nozzle should be made of material which hardly react with a melt of semiconductor material. The nozzle for use in an oxidizing atmosphere such as the air use may be made of platinum, platinum-rhodium and the like.

In vacuum or reducing atmosphere, it is preferable to use carbon, tungsten, molybdenum or their alloys and boron nitride for nozzle material.

In case of treating semiconductor material having a comparatively low melting point such as 1,400° C., fused silica may be used, if an operating time is limited. Further, as the top end configuration of the nozzle, use may be made of circular, elliptic, slit and the like, but any configuration can be selected in accordance with a width of semiconductor thin ribbon wafer to be obtained. A wide or broad thin ribbon wafer can be obtained by properly selecting the nozzle configuration. When the inner surface of a nozzle is lined with for example boron nitride, the melt semiconductor material can easily be ejected and the manufacture thereof becomes easy.

The melt semiconductor material should be ejected through the nozzle under a given pressure. If the ejection pressure is too high or too low, a configuration of thin ribbon wafer becomes deteriorated or irregular. Therefore the ejection pressure is preferably within the range of 0.01–1.5 atm.

In order to obtain the semiconductor thin wafer of excellent quality, the melt should be rapidly cooled upon being ejected on the moving or rotating surface of the moving or rotating substrate and thus the moving or rotating substrate having good machinability and thermal conductivity should be used. For instance, use may be made of the moving or rotating substrate consisting of copper, copper alloys, aluminum, iron, steel, stainless steel, fused silica, semisintered porcelain and the like.

If a revolution speed of this rotating member is too slow, a thickness of the semiconductor thin ribbon wafer becomes thick to flaky or powdery, so that the linear velocity of the surface of the rotating member is preferably more than 5 m/sec.

A diameter of the moving or rotating substrate may be determined depending upon each condition, such as the melting temperature of semiconductor material, the revolution speed of the rotating member and the ejecting pressure through the nozzle. For instance, even if linear velocities of surfaces of two rotating drums having different diameters are made identical with each other, centrifugal force produced by the rotating substrate of larger diameter is smaller than that of the rotating substrate of smaller diameter, so that the semiconductor thin wafer of good quality cannot be obtained from material having large adhesivity to the rotating surface. Further if a semiconductor material melt has small adhesivity, a good semiconductor thin wafer cannot be produced, because a cooling time is too short and at least a part of the melt state is contained in an atmosphere.

As the rotating substrate, use may be made of a disc or a drum, and in both cases, it is preferable to use a smooth and flat rotating surface as a cooling surface.

BRIEF DESCRIPTION OF THE DRAWINGS

The present invention will be explained in more detail referring to the accompanying drawings.

FIG. 14 is a graph expressing hall mobilities of the thin ribbon wafer, single crystal and chemical vapour deposited polycrystal of silicon.

DESCRIPTION OF THE PREFERRED EMBODIMENTS

Figure 1:
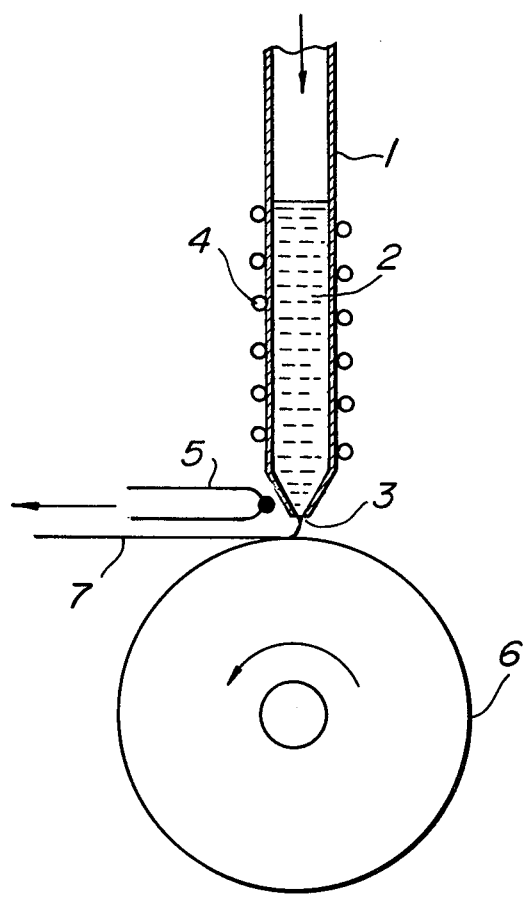
FIG. 1 is a fundamental diagrammatical view of an apparatus for manufacturing a thin ribbon wafer of semiconductor material according to the invention.

In FIG. 1, a reference numeral 1 designates a heat resisting tube, 2 a melt of semiconductor material, 3 a nozzle, 4 a heater, 5 a thermocouple, 6 moving or rotating cooling substrate, 7 a thin ribbon wafer of semiconductive material, respectively.

In FIG. 1, a melt of semiconductor material 2 consisting of germanium is contained in a heat resisting tube 1. The heat resisting tube 1 is composed of a fused silica tube lined with boron nitride. The heat resisting tube 1 is provided with a nozzle 3 having a diameter of 0.1–0.5 mm at its free end. The melt of semiconductor material 2 in the heat resisting tube 1 is maintained at a temperature of 940°–980° C. by means of a heating resistor 4. Below the heat resisting tube 1 is rotatably arranged a cooling substrate 6 made of stainless steel. The cooling substrate 6 is 300 mm in diameter and rotated at a speed of 2,000 rpm. The cooling substrate 6 is formed by a drum having a smooth and flat peripheral surface. The nozzle 3 is arranged close to the smooth and flat rotating surface of the drum 6. The melt of germanium in the heat resisting tube 1 is ejected on the rotating surface through the nozzle 3 with adjusting the ejecting pressure within a range of 0.03–1.5 atmospheric pressure. As soon as the melt germanium is made in contact with the rotating surface of the drum 6 the melt is quickly cooled on the rotating surface and a semiconductor thin ribbon wafer having a fine and compact microscopic structure is obtained in a continuous manner.

The thus obtained thin ribbon wafer of semiconductor is 5–30 μm in thickness and 0.1–0.8 mm in width. It was ascertained by an X-ray diffraction image that this thin ribbon wafer was substantially composed of a uniformly fine crystalline texture over the whole or on a substantial part.

Figure 2:
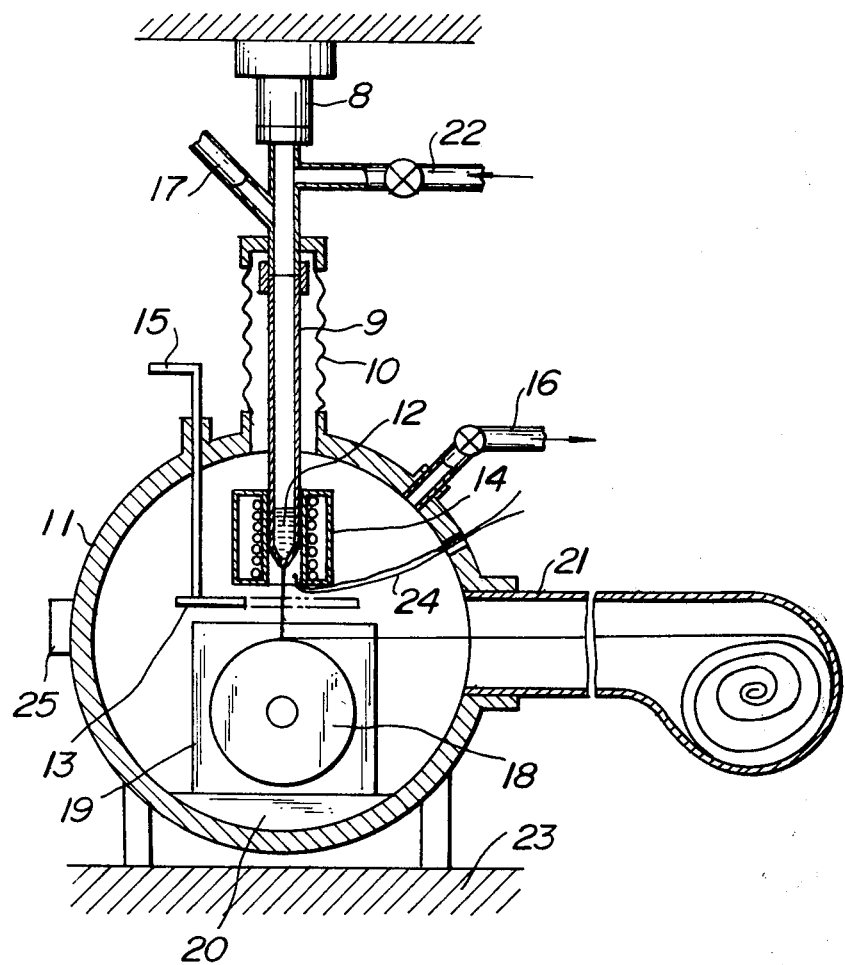
FIG. 2 is a sectional diagrammatical view showing experimental apparatus comprising a vacuum chamber.

Further, the thin ribbon wafer of silicon semiconductor was manufactured in vacuum with the use of a device shown in FIG. 2. In FIG. 2, a silicon material 12 is inserted into a heat resisting silica tube 9 and heated to be molten at a temperature of 1,650° C. in an electric furnace 14. A temperature can be measured by a thermocouple 24. In this case, the vacuum chamber 11 placed on a base 23 is evacuated from an outlet 16 by a vacuum pump (not shown) and maintained at high vacuum of $10^{-4}$ Torr. The chamber is provided thereon with a terminal plate 25 and is further provided therein with a cooling device comprising a rotating cooling drum 18 made of copper having a diameter of 40 mm and a thickness of 10 mm secured to a variable speed motor 19, arranged on a support 20, whose speed varies 0–30,000 rpm. The pressures in the vacuum chamber 11 can be reduced within the range of $10^{-4}$–760 Torr, and the atmosphere can be replaced by nitrogen, argon gas and the like for further pressure reduction. Prior to ejecting the silicon melt 12, a shutter 13 is opened by handing a knob 15. The shutter 13 is made closed before ejecting for preventing the drum 18 from being heated. Then, an electromagnetic valve (not shown) is turned on to actuate a cylinder 8 so as to lower the tube 9 to a position immediately above the rotating drum 18 which is rotated at a speed of 0–30,000 rpm, and argon gas at 0.5 atmospheric pressure is forced into the tube through a gas inlet 22. The melt of silicon is rapidly cooled on a rotating substrate drum and is throwing away in a form of thin wafer and gathered together in a collecting port 21 for taking out after the completion of the ejecting. In this experimental device, it is possible to charge a raw material into an inlet 17 after the tube 9 has been heated. This device has an advantage in that any damage such as deformation or oxidation in the thin ribbon wafer due to collision with the fluid in atmosphere resulting from the rapid formation of the thin wafer by the evacuation of vacuum chamber is considerably mitigated by reducing an atmospheric pressure, so that this device is very effective for obtaining long thin ribbon wafers. In order to prevent an excessive oxidation, it is preferable to use an inert gas as the atmosphere at the reduced atmospheric pressure.

The thus obtained silicon thin ribbon wafer by rapidly cooling the melt of silicon was 2.0 mm in width, 10 μm in thickness and more than 10 cm in length. The thin wafer was made into a thinner one of about 0.5 μm in thickness by etching, whose electron beam diffraction pattern was observed by a 1,000,000 V perspective electron microscope. As a result, it has been found that the thin wafer of silicon semiconductor was of a fine homogeneous crystalline texture.

In another embodiment, 0.40 of germanium, 0.5 of silicon, 0.05 of boron and 0.05 of phosphorus in atomic ratio were heated together in a molybdenum tube by means of a tungsten heater to form a melt and the melt was ejected onto a smooth and flat outer surface of a drum type rotating cooling substrate made of beryllium copper alloy having 50 mmφ in diameter rotating at 2,000–20,000 rpm with the aid of argon gas at 0.03–1 atmospheric pressure through a nozzle having a diameter of 0.1–0.5 mmφ to obtain a thin ribbon wafer consisting of 0.4 germanium, 0.5 silicon, 0.05 boron and 0.05 phosphorus in atomic ratio and having 10–40 μm in thickness and 0.2–1.0 mm in width. In this case, the whole device was put into the above vacuum chamber 11 which was maintained at 1 atmospheric pressure or $10^{-3}$ Torr. Further, the vacuum chamber was previously filled with argon gas and the pressure in the chamber was reduced. The non-oxidizing atmosphere is effective to prevent an oxidation of the surface of the thin ribbon wafer. Further, the effect of pressure reduction is remarkable in this embodiment. The damage such as deformations or creases due to the collision of the thin ribbon wafer with the gas is reduced to vacuum or the reduced pressure, and as a result, a long thin ribbon wafer having a good quality becomes obtainable.

In a further embodiment, ZnTe was molten in a platinum-rhodium tube and kept at a temperature immediately above the melting point of 1,239° C. and was ejected through a nozzle of 0.1–0.4 mmφ onto a smooth and flat surface of a stainless steel drum of 20 mmφ in diameter, rotating 6,000 rpm at 0.03–1 atmospheric pressure to obtain a semiconductor thin ribbon wafer. When a part of this thin ribbon wafer was observed by a polarizing metal microscope, it was in the dark grey state under the cross nicol state, and a boundary of crystal of the thin wafer was only visible, and a characteristic of the fine and compact crystalline texture close to amorphous state was observed. The electric and magnetic properties of these thin semiconductor ribbon wafers were examined and it is found that these electric and magnetic properties are comparatively superior than that of the conventional semiconductor thin wafers.

Besides the above properties, the characteristics of the semiconductor thin ribbon wafer obtained by the method according to the invention will be explained as follows.

As mechanical strength, if thin wafers having same thickness and same size are bent, its bending strength upto a fracture limit shows a high value of 2–3 times of those of semiconductors with a common crystalline texture. In other words, the mechanical strength of the thin ribbon wafer according to the invention is considerably higher.

As described above, according to the invention, a semiconductor thin ribbon wafer is obtained under the fine texture state by ejecting a melt of semiconductor material through a nozzle and rapidly cooling it on the moving surface of a cooling substrate at a cooling rate of more than 1,000° C./sec up to 1,000,000° C./sec. The thus obtained thin ribbon wafer can be manufactured at a remarkably high speed as compared with the conventional method for manufacturing a conventional semiconductor wafer with the polycrystal texture and thus is very effective for use in such an apparatus that a great number of semiconductor elements are required.

The semiconductor thin ribbon wafer having the fine and compact crystalline texture is usable as rectifiers, junction element by ion implantation, varisters, thermistors, memory elements, photoelectric elements, photo cells, thermo electric elements, electronic cooling elements, atomic cell elements and the like, and remarkably valuable in industry.

The present invention can be carried out not only by a nozzle having a single nozzle hole, but also by a nozzle having multi nozzle holes.

The embodiment with respect to the multi nozzle according to the invention will be explained in detail with reference to the following embodiments illustrated in FIGS. 3–12.

A nozzle according to the present invention can have a circular single hole as shown in FIG. 3; a longitudinally extended elliptical hole shown in FIG. 4; but also a nozzle having two round holes aligned in FIG. 5. Further, according to the invention, a thin ribbon wafer of semiconductor having large width is manufactured with the use of a laterally or longitudinally extended multi-hole nozzle parallelly arranged in lateral or longitudinal direction as shown in FIGS. 6, 7, 8, 9, 10, 11 and 12.

Figure 3A:
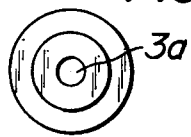
FIG. 3 illustrates a heat resisting tube having a single round ejecting nozzle hole for carrying out the method of the present invention.
Figure 3B:
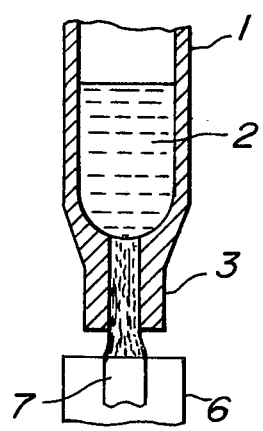

FIGS. 3a and 3b are bottom and cross sectional views showing a regular nozzle. This nozzle has a circular ejecting nozzle hole 3a having a diameter of 0.1–1 mm and its characteristic is to be capable of obtaining a thin ribbon wafer of semiconductor 7 having a width not smaller than the diameter even by ejecting a melt of semiconductor material having high viscosity through the nozzle hole.

Figure 4A:
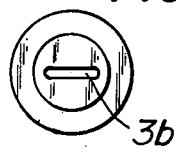
FIG. 4 illustrates a nozzle having a laterally extended elliptical ejecting nozzle hole for carrying out the present invention.
Figure 4B:
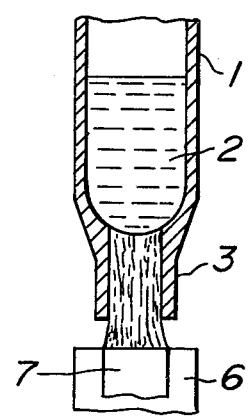

FIGS. 4a and 4b show a nozzle having an elliptical hole 3b. A characteristic of this nozzle is that the nozzle is suitable for manufacturing a thin ribbon wafer of semi-conductor 7 having a comparatively large width and capable of manufacturing a thin ribbon wafer of semiconductor having a fairly large width.

Figure 5A:
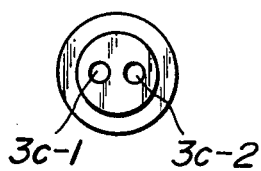
FIG. 5 shows a nozzle having two round holes arranged in a lateral direction for carrying out the present invention.
Figure 6A:
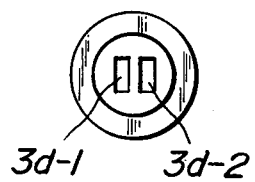
FIG. 6 illustrates a nozzle having two rectangular ejecting nozzle holes arranged in a lateral direction for carrying out the present invention.
Figure 5B:
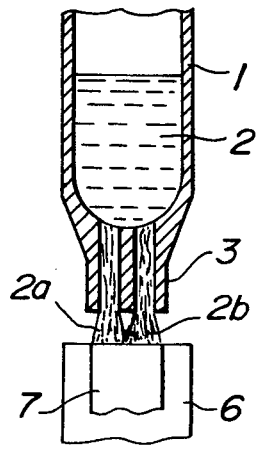
Figure 6B:
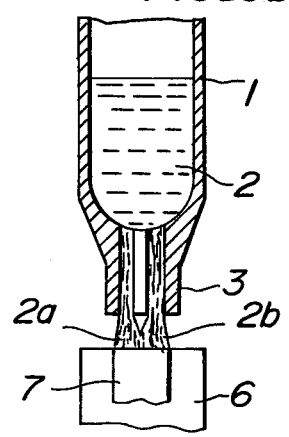

FIGS. 5a and 5b; FIGS. 6a and 6b show other embodiments of a nozzle 3 having two ejecting nozzle holes aligned adjacent to each other in a lateral direction. FIGS. 5a and 5b show a nozzle 3 having two circular ejecting nozzle holes 3c-1, 3c-2 viewing from the end of nozzle, and FIGS. 6a and 6b show the nozzle 3 having two longitudinally extended rectangular holes 3d-1, 3d-2 arranged in parallel. A rotary axis of a rotating cooling substrate 6 is aligned in parallel to the direction for connecting the centers of these ejecting nozzle holes 3c-1 and 3c-2, 3d-1 and 3d-2, respectively. The principle for using this nozzle 3 is as follows. As described above, the width of a thin ribbon wafer of semiconductor is generally wider than that of the nozzle hole. That is, a closely ejected melt 2 is widened in diameter when impinged upon a rotating cooling substrate 6 from the ejecting nozzle hole of the nozzle 3. As shown in FIG. 5, if two ejecting nozzle holes 3c-1 and 3c-2 are closely aligned, two parallel jet flows 2a and 2b of melt are impinged upon the rotating cooling substrate 4 and amalgamated with each other thereon. As shown in FIG. 6, if the longitudinally extended rectangular ejecting nozzle holes 3d-1 and 3d-2 are closely aligned, the two parallel jet flows 2a and 2b of melt get close the circular cross-section by surface tension during flowing down and amalgamated around at the surface of rotating cooling substrate 6. In this manner, a thin ribbon wafer of semiconductor having a substantially twice time larger width than that of the image nozzle hole can be obtained. Semiconductor material thus becomes a thin ribbon wafer of semiconductor having a large width. A size of the ejecting nozzle holes employed in this case is 0.6 mm$\phi$ in diameter and 70 $\mu$m in nozzle hole space in case shown in FIG. 5 and 1 mm in length, 0.5 mm in width and 60 $\mu$m in nozzle hole space in case shown in FIG. 6. In both cases, use is made of a fused silicate tube as nozzle material and the ejecting nozzle holes are manufactured by means of an ultrasonic processor. The above semiconductor material is molten at a temperature of 1,300° C. and cooled in super high speed by means of a rotating copper drum type substrate 6 under a pressure of 1 atom., a radius of 300 mm$\phi$, a thickness of 10 mm and a number of rotation of 2,000 rpm.

Figure 7A:
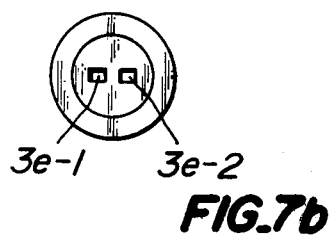
FIG. 7 illustrates a nozzle having two laterally extended rectangular ejecting nozzle holes arranged in one direction.
Figure 7B:
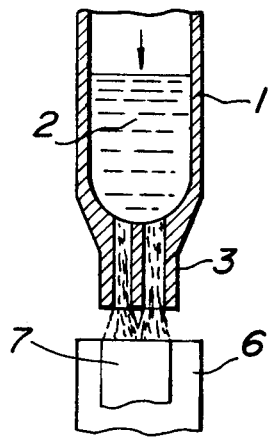
Figure 8A:
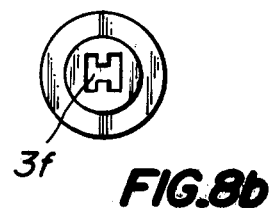
FIG. 8 illustrates a nozzle having H-shape ejecting nozzle hole in a cross section for carrying out the present invention.
Figure 8B:
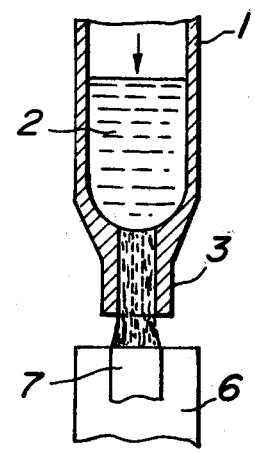

A nozzle 3 having elongated two nozzle holes 3e-1 and 3e-2 sufficiently closed with each other as shown in FIGS. 7a and 7b is suitable for manufacturing a comparatively thin ribbon wafer. This nozzle 3 can be applied to the manufacture of a semiconductor thin ribbon wafer having a large width under the condition similar to that for manufacturing the thin ribbon wafer with using the conventional single hole nozzle. In particular, a semiconductor thin ribbon wafer having a width of 7 mm was obtained by ejecting the melt heated at a temperature of 1,300° C. under 0.6 atmospheric pressure through the nozzle 3 made of molten quartz provided with two rectangular holes 3e-1 and 3e-2 of 0.6 mm in length and 3 mm in width spaced apart from each other by 50 $\mu$m and by rapidly cooling the melt by bringing it in contact with the rotating cooling drum type substrate 6. In case that the viscosity of the molten jet is low, if use is made of the nozzle 3 having the ejection nozzle hole 3f, in which a center portion of the partition for spacing two elongated square type ejection nozzle holes 3e-1 and 3e-2 is removed by 50–100 $\mu$m as shown in FIGS. 8a and 8b, a more preferable result can be obtained.

Figure 9A:
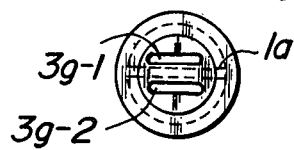
FIG. 9 illustrates a nozzle having two laterally extended elliptical ejecting nozzle holes arranged in parallel direction for carrying out the present invention.
Figure 9B:
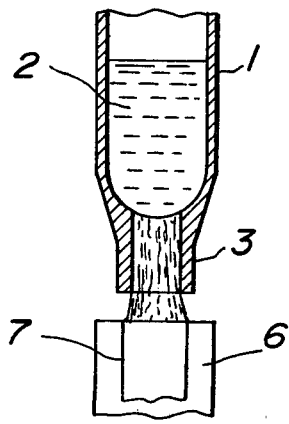

FIGS. 9a and 9b show another embodiment of the nozzle in which two elongated elliptical type ejection holes 3g-1 and 3g-2 are arranged side by side viewed in the direction of the rotation of the cooling substrate 6. Each of these nozzle holes is located in a chamber formed by a partition 1a for containing two kinds of semiconductor materials. When melts are ejected through these nozzle holes 3g-1 and 3g-2, it is possible to produce a double-layered thin ribbon wafer. In the embodiment of this nozzle, provision is made of two ejection nozzle holes having 0.2 mm in length and 0.7 mm in width vertically spaced apart from each other by 50 $\mu$m. With the use of this nozzle, germanium and silicon are separately charged into the nozzle chamber and separately molten in the above two nozzle chambers at a temperature of 1,500° C., these two chambers are communicated to a common pressure source for ejecting at a common atmospheric pressure of 0.7 and rapidly cooled by ejecting onto said rotating cooling substrate 6 at a cooling rate of 1,000°–1,000,000° C./sec. Further, P-type silicon and N-type silicon are cooled under the similar condition with the use of this nozzle at a temperature of 1,500° C. and an atmospheric pressure of 0.5. The thus obtained thin ribbon wafer is of a double-layered structure having about 0.8 mm in width and about 50 $\mu$m in thickness. In this manner it is possible a semiconductive thin ribbon wafer having a p-n junction.

Figure 10A:
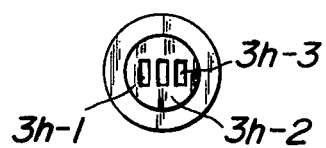
FIG. 10 illustrates a nozzle having a plurality of longitudinally extended rectangular ejecting nozzle holes arranged in parallel direction for carrying out the present invention.
Figure 10B:
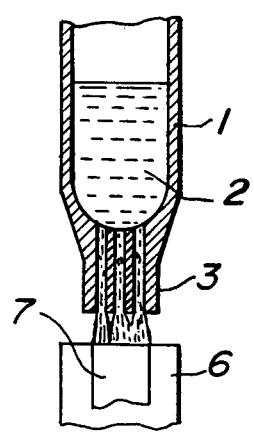

FIGS. 10a and 10b illustrate another embodiment of the nozzle having three elliptical ejection nozzle holes 3h-1–3h-3. In this case, as far as three nozzle holes are not spaced apart from each other, a thin ribbon wafer three times wider than the width of ejection nozzle holes can be obtained. That is, for example, three elliptical ejection nozzle holes having 1 mm in length and 0.7 mm in width are spaced apart from each other by 100 $\mu$m, the thin ribbon wafer having a width of 2.3 mm was produced. This embodiment is suitable for manufacturing a comparatively thick ribbon type thin wafer of semiconductor. The multi-hole nozzles of the present embodiment and the preceding embodiments are not preferable, if a space between the ejection nozzle holes is too wide, because creases might be formed in the finally obtained thin ribbon wafers. In case, except the positive use of this crease, it is preferable to make a thickness of the partition between the ejection nozzle holes at least less than ⅓ of the longest size of the ejection nozzle hole, and it is more preferable to make the thickness 1/5 to 1/10. By using such a nozzle, the thin ribbon wafers of semiconductor having a desired width were obtained. However, if a thickness of the partition is too thin, such as less than 40 $\mu$m, the partition is easily broken.

Figure 11A:
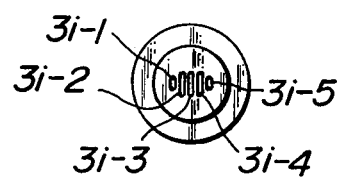
FIG. 11 illustrates a nozzle having a plurality of three longitudinally extended elliptical ejecting holes arranged in parallel direction for carrying out the present invention.
Figure 11B:
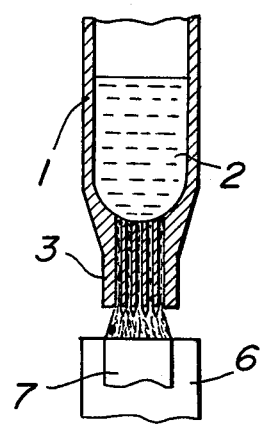

FIGS. 11a and 11b show still another embodiment of the multi-hole type nozzle having five long elliptical ejection nozzle holes 3i-1–3i-5 laterally aligned in a row. With the aid of such a nozzle, a thin ribbon wafer of semiconductor having a width about 5 times larger than the diameter of the ejection nozzle hole is formed. The principle of this nozzle is as follows. For comparison, in the nozzle shown in FIG. 4, a length of the laterally elongated elliptical ejection nozzle hole 3b is same as a total length of the ejection nozzle hole row of the nozzle shown in FIG. 11. When the jet of the melt is flown down through the wide elliptical nozzle hole 3b, the width of the molten jet flow becomes gradually narrow as flowing down and at the same time a thickness of the molten jet flow measured in a direction perpendicular to the width becomes thick. If the width of the molten jet flow becomes large, the defect might often occur at the center position or any other position of the thin ribbon wafer. It means that the molten jet flow is not uniformly flown down over the width but both side portions of the jet flow are obliquely flown down toward the center, so that the jet flow is concentrated into the center portion. In the embodiment shown in FIG. 11, however, the ejection nozzle holes 3i-1–3i-5 are laterally aligned in a row, each jet flow is flown down in parallel to each other, and all the jet flows are amalgamated on the surface of rotating cooling substrate 6. This principle is same as the embodiments shown in FIGS. 5 and 6. The nozzle shown in FIG. 11 has the following specification as compared with the embodiment shown in FIG. 10. Three central holes 3i-2, 3i-3, 3i-4, form a main hole row and two slightly small sub-holes 3i-1 and 3i-5 on both sides of the main hole row have about 80% hole width as compared with three main holes for reducing an edge effect on both sides of the thin ribbon wafer. In one embodiment of the invention, the width of the main hole is 0.8 mm$\phi$, the width of the sub-hole is 0.7 mm and the space of the ejection nozzle holes is 80 $\mu$m. The ejection holes of this embodiment can easily be formed with the aid of an untrasonic machine. By rapidly cooling a silicon melt with the use of the present nozzle under the condition previously found by the inventor, thin ribbon wafers of silicon semiconductor having about 5 mm to 10 mm in width were obtained.

Figure 12A:
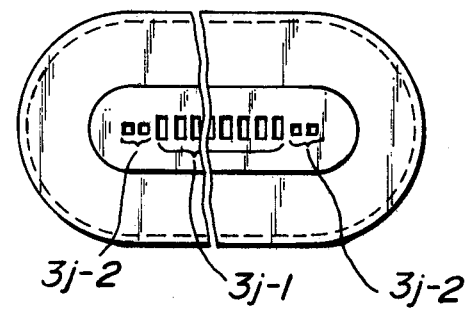
FIG. 12 illustrates a nozzle having a plurality of longitudinally extended rectangular ejecting holes arranged in lateral direction and having a pair of sub-ejecting holes arranged in both outermost portions for carrying out the present invention.
Figure 12B:
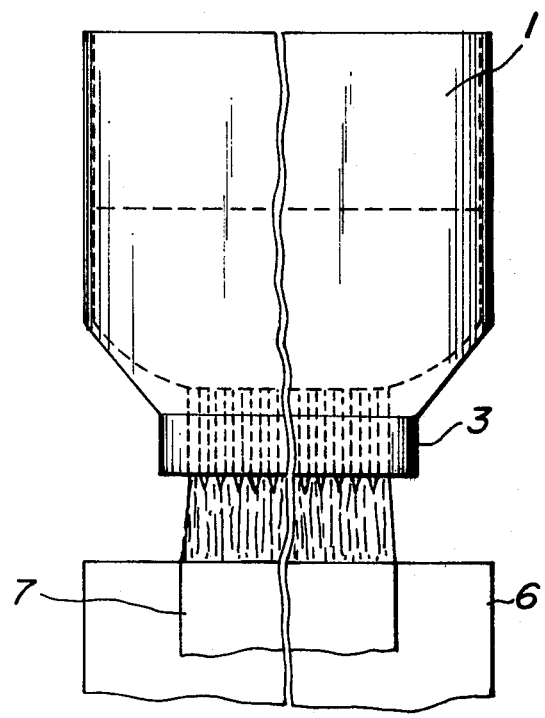

FIG. 12 shows a nozzle comprising a plurality of rectangular main holes 3j-1 and two auxiliary holes 3j-2 arranged on each side of main hole array for ignoring an edge effect to a great extent. According to this nozzle, a thin ribbon wafer an optional with can be formed in principle. As the main nozzle hole 3j-1, use may be made of a merely rectangular hole, a long circular elliptical hole, and any shape which can uniformly combine said melt jet flows over the whole width of wide thin ribbon wafer. With the aid of this nozzle, thin ribbon wafer of semiconductor having any desired width can be obtained.

As nozzle material, each kind of material can be selected in accordance with purposes. For example, fused quartz can be used over the range of 1,000° C. or more than that, i.e., several hundred degrees in centigrade. As nozzle material, use is made of heat resisting ceramics such as $Al_2O_3$, MgO, beryllium oxide, etc. The nozzle made of such ceramics is preferably lined with boron nitride at a lower portion, particularly on an inner surface. In this case, semiconductor material can be molten at a high temperature. Particularly, a nozzle made of boron nitride has been found preferable for manufacturing the semiconductor thin ribbon wafer. Particularly, when a reduced atmosphere or vacuum is required, this nozzle material is effective and preferably available for a vacuum tank. The lining of the lower portion, particularly the inner surface of the nozzle lined with niobium nitride, is very effective for weakening a reaction of the melt with nozzle material.

The embodiment with respect to manufacture a ribbon type thin wafer of semiconductor material will be explained in detail with reference to the following examples.

EXAMPLE 1

In a transparent quartz tube having a nozzle at its end, a pure silicon having a purity of $10^{-8}$ was heated to 1,550° C. to form a uniform melt thereof. The melt thus formed was ejected through the nozzle onto a drum made of beryllium copper alloy and having a diameter of 300 mm, said drum being placed in a vacuum of $10^{-8}$ Torr, and rotated at a speed of 2,500 rpm.

A silicon thin ribbon wafer obtained in this example has a typical thickness of 30 $\mu$m and a length of 10 cm. A resistivity of the wafer is $10^8$ $\Omega$-cm and a greater part i.e. more than 50% by volume is formed by grains having diameters of about 3 to 50 $\mu$m. Fine and condensed crystalline structure is grown in such a manner than an axis [110] situates within $\pm 40°$ with respect to a normal to the wafer surface. It should be noted that the thickness of wafer can be varied within a range of 5–200 $\mu$m. The break down test for the wafer expressed that bending radii of the wafers having thicknesses of 5 $\mu$m, 30 $\mu$m and 200 $\mu$m are 0.5 cm, 5 cm and 20 cm, respectively. Such a strength against bending is sufficient for manufacturing actual semiconductor devices. Such a large bending strength can be conceived by the fact that crystal axes of the fine crystalline grains have orientated substantially in the same direction. Such an orientation of the crystal axes is very suitable for electrical properties of the semiconductor thin ribbon wafer, because a property of the crystal surface such as a surface potential density can be determined simply and a recombination probability at a crystal interface is reduced.

EXAMPLE 2

In the transparent quartz tube raw materials consisting of pure silicon having added thereto P, Sb, B and Sn, respectively by an as much amount as can form a solid solution was heated over a melting point. A melt was ejected through the nozzle onto a copper drum rotating at 2,300 rpm. The drum had a diameter of 400 mm and was placed in a vacuum of $10^{-8}$ Torr.

Thin ribbon wafers obtained in this example 2 have substantially same thickness, length and grain diameter as those of the first example 1. However the resistivity was reduced as compared with the example 1 to a greater extent. The resistivities and impurity concentrations of the thin ribbon wafers are shown in the following table.

| Added Element | Resistivity | Impurity Concentration |
|---|---|---|
| P | $10^{-3}$ Ωcm | $10^{18}/cm^3$ |
| Sb | $10^{-2}$ cm | $10^{18}/cm^3$ |
| B | $10^{-2}$ cm | $10^{18}/cm^3$ |
| Sn | — | — |

It should be noted that even if tin was added to silicon by 25%, it was possible to form a flexible thin ribbon wafer.

EXAMPLE 3

In the transparent quartz tube pure silicon having added B thereto was heated to form a melt thereof. The melt was ejected through the nozzle onto a stainless steel drum and a stainless steel endless belt, respectively arranged in the air. The drum has a diameter of 180 mm and was rotated at a speed of 3,000 rpm. The belt was travelled at a linear speed of 20 m/s.

In the present example thin ribbon wafers of p conductivity type having a width of about 6 mm and a length of several centimeters were obtained. An oxygen distribution into a depth direction was measured by a combination of an ion etching and an Anger's electron spectroscopic method and it was found that below a hundred and several ten Å from the surface of silicon oxide was observed and in a deeper region an oxide concentration was abruptly decreased. The resistivity of the deeper region was about 0.01 Ω-cm. It was found that the wafer has a preferable property for forming semiconductor devices such as a substrate for growing a semiconductor crystal including polycrystal, a thin film wafer, a ribbon, sheet and the other material for semiconductor elements. From a light absorption spectrum measurement it was further found that the thin ribbon wafer obtained in this example situates at an intermediate position between a single crystal state and an amorphous state.

EXAMPLE 4

The thin ribbon wafers obtained in the example 3 were subjected to a heat treatment in a vacuum and inert gas under the various conditions. A first sample of the thin ribbon wafer was heated at 500° C. for one week, a second one was heated at 1,100° C. for 48 hours and a third one was heated at about a melting point for 0.1 second. The last sample was dropped through a pipe type furnace heated at 1,420° C. The heat treatment has resulted in that the grain of the crystalline structure was grown. That is to say in the first, second and third samples, the grain size was increased by 1.1, 5 and 2 times, respectively as compared with the that of the ribbon wafer before the heat treatment. In the wafer thus treated there were grains having diameters of 5–500 μm. It was also found that the columnar structure of the ribbon wafer was improved by the heat treatment and the [110] axes of almost all grains were directed in a direction normal to the wafer surface. A light absorption spectrum was deflected towards the single crystal side. The electrical property of the ribbon wafer subjected to the heat treatment becomes similar to that of the single crystal. That is the resistivity of the wafer thus treated was decreased by more than 80% of that of the wafer as grown. When the grain size becomes large and the resistivity is decreased, a possibility of a recombination of electrons and holes situated at a boundary of grain surfaces is reduced and thus a recombination rate is decreased so as to prolong a life time of electrons and holes. Further a mobility is increased by the heat treatment.

When all samples were further heated at 1,400° C. for 24 hours the substantially whole width of the wafer was occupied by a single grain.

From the various experiments it is found that the grains of the thin ribbon wafer as grown are extremely increased in size by the heat treatment at a temperature within a range from 500° C. to a melting point for a time period within a range from 0.1 second to one week. Particularly the better result can be obtained by heating the wafer at about the melting point thereof. The heating may be effected in vacuum or in an inert gas such as argon.

Figure 13:
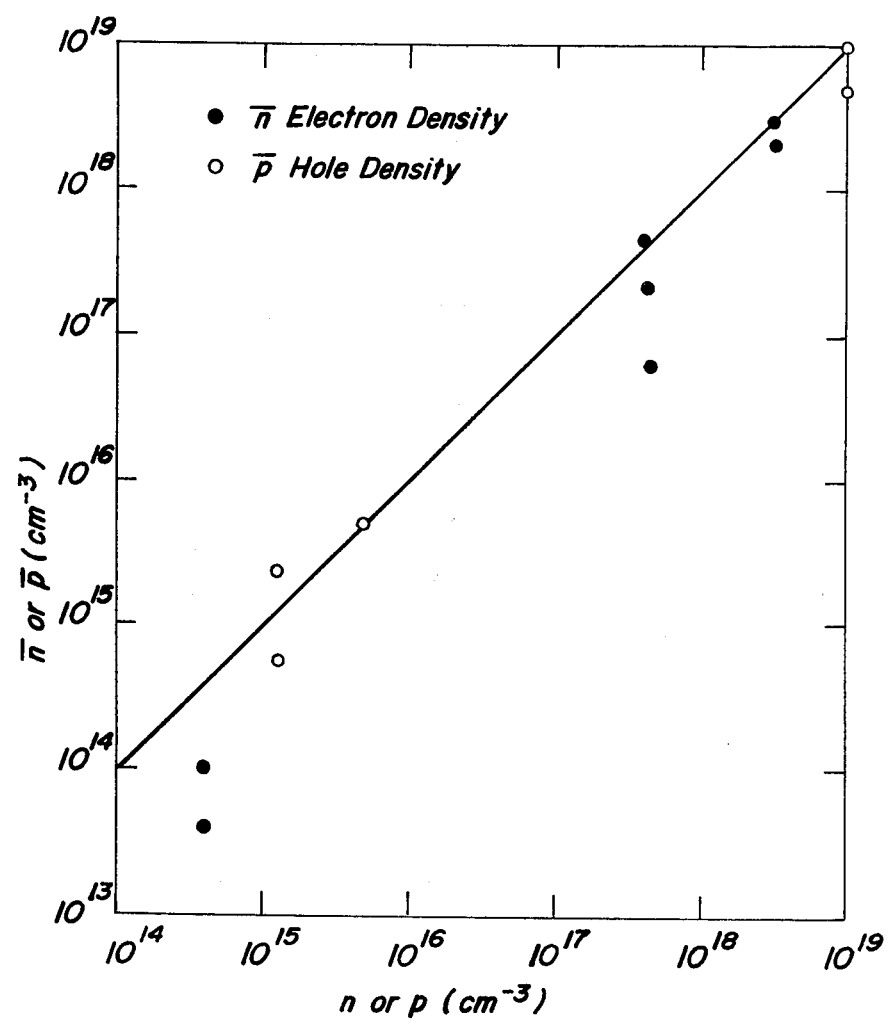
FIG. 13 is a graph showing a relation of an impurity concentration between raw semiconductor material and the thin ribbon wafer.

FIG. 13 is a graph showing an impurity concentration characteristic of the thin ribbon wafer according to the invention. In the graph, an abscissa represents an impurity concentration of raw material, i.e. starting material and an ordinate an impurity concentration of the thin ribbon wafer as grown. Black dots express an electron density and vacant dots a hole density. As can be clearly seen from the graph the both concentrations correlate linearly to each other. This means that when the impurity concentration of the charge is selected to a desired value, the thin ribbon wafer as grown can also have the same desired impurity concentration. This is very preferable to manufacture various semiconductor devices.

FIG. 14 illustrates a graph showing a hall mobility of the thin ribbon wafer as grown according to the invention. In the graph curves A and B show n-type and p-type mobilities, respectively of the single crystal of silicon. A curve C represents a hall mobility of a polysilicon formed by a chemical vapour deposition. Black dots and vacant dots express n-type and p-type mobilities, respectively of the thin ribbon wafer according to the invention. As can be understood from the graph, the hall mobility of the thin ribbon wafer is superior to that of the known CVD polysilicon and is comparative with that of the single crystal thereof. It has been further found experimentally that the hall mobility of the wafer according to the invention can be increased by about two times by subjecting it to the heat treatment.

It is very important to select the material of cooling substrate depending upon semiconductor material to be used by taking into account a wettability between the melt of semiconductor material and the cooling substrate. The wettability is mainly determined by surface tensions of the melt and the substrate, and the viscosity of the melt. When the melt temperature is too high more than 300° C. above the melting point, the melt might spread over the cooling surface of the substrate so that the ribbon wafer becomes too thin and some times a greatly notched ribbon similar to a rattan blind might be produced, while when the melt temperature is too low, the jet flow of the melt might not creep along the surface of the substrate, so that the jet flow is divided into a number of small particles having irregular configuration. According to the invention, it is preferable to select such a viscosity of the melt that edges of the melt are made in contact with the substrate at an angle from 10° to 170° with respect to the substrate surface. For this purpose, a temperature of the melt should be selected within the range from the melting point to 300° C. above the melting point, particularly 100° C. to 150° C. above the melting point.

It is also very important that the melt of semiconductor material should be instantaneously very rapidly cooled on the cooling substrate at a suitable cooling rate of at least 1,000° C./sec, preferably 1,000 to 1,000,000° C./sec by taking account of wettability between the melt of semiconductor material and the cooling substrate.

According to the invention, it has been found that the pressure under which the melt is ejected through the nozzle should be within the range of 0.01–1.5 atm.

The ejection of the melt is preferably effected in a vacuum but it may be carried out in an inert gas or reducing gas atmosphere. Even in the latter case, it is preferable to reduce the pressure.

According to the invention, it is possible to manufacture the thin and flexible ribbon wafer of semiconductor material of a fine microscopic structure of high density having a large mechanical strength and an excellent electrical property. Therefore, various semiconductor devices can be manufactured with using such a ribbon wafer in a simple and reliable manner.

What is claimed is:

1. A method for manufacturing a thin and flexible ribbon wafer of semiconductor material comprising:
   heating a raw semiconductor material consisting essentially of a material selected from the group consisting of Ge, Si, Se, Te, InSb, ZnTe, PbSe, InAs, InP, GaSb, PbTe, ZnS, $Bi_2Te_3$ at a temperature within the range from a melting point of the raw semiconductor material to 300° C. above the melting point to form a uniform melt having a suitable wettability and viscosity;
   ejecting a jet flow of the melt through a nozzle under a predetermined pressure within the range from 0.01 to 1.5 atm.; and
   substantially instantaneously cooling the ejected jet flow of the melt by moving a cooling surface of a moving cooling substrate past the nozzle so that the melt contacts the cooling surface and is cooled at a cooling rate of 1,000° C. to 1,000,000° C./sec., the linear velocity of the surface of the cooling substrate being more than 5 m/sec., to thereby form a thin and flexible ribbon wafer having a fine and compact grain structure with more than 50% of the grains having diameter within the range from 1 to 100 μm without existing ordered lattice, said ribbon wafer having a thickness of from 5 to 200 μm.

2. A method as defined in claim 1, wherein the raw semiconductor material is heated at a temperature within the range from a melting point of the raw semiconductor material to 300° C. above the melting point.

3. A method as defined in claim 1, wherein the ejection of the melt against the cooling surface is carried out in a reduced pressure or a vacuum.

4. A method as defined in claim 1, wherein the ejection of the melt against the cooling surface is conducted in an inert gas atmosphere of reduced pressure.

5. A method as defined in claim 1, wherein the ejection of the melt against the cooling surface is conducted in a reducing gas atmosphere of reduced pressure.

6. A method as defined in claim 1, wherein the melt is ejected through a nozzle made of material selected from the group consisting of platinum, platinum-rhodium, tungsten, molybdenum, tantalum, graphite and alloys thereof.

7. A method as defined in claim 6, wherein the nozzle is lined with boron nitride.

8. A method as defined in claim 1, wherein the melt is ejected through a nozzle made of substance selected from the group consisting of boron nitride, silicon nitride, silicon carbide and carbon.

9. A method as defined in claim 1, wherein the melt is ejected against a cooling substrate made of material having a large cooling effect.

10. A method as defined in claim 9, wherein the cooling substrate is made of material selected from the group consisting of copper, copper-beryllium, brass, stainless steel and carbon steel.

11. A method as defined in claim 1, wherein the cooling substrate comprises a rotating drum having a smooth peripheral surface which serves as the cooling substrate.

12. A method as defined in claim 1, wherein the cooling substrate comprises a rotating drum having a smooth inner surface which serves as the cooling substrate.

13. A method as defined in claim 1, wherein the cooling substrate comprises an endless belt conveyor having a smooth outer surface which serves as the cooling substrate.

14. A method as defined in claim 1, wherein the nozzle comprises a single hole having a circular, elliptical or rectangular configuration.

15. A method as defined in claim 1, wherein the nozzle comprises a plurality of multi-nozzle holes having a circular, elliptical or rectangular configuration and said multi-nozzle holes being aligned close to each other in a direction extending transverse to a moving direction of the ejected melt so that a plurality of jet flows of melt can be combined with each other on the surface of cooling substrate.

16. A method as defined in claim 15, wherein the nozzle comprises at least three aligned holes and wherein the width of outer nozzle holes is smaller than that of the intermediate nozzle holes.

17. A method as defined in claim 15, wherein the nozzle comprises a partially removed partition wall within the tube for separating adjacent holes.

18. A method as defined in claim 1, wherein the nozzle comprises at least two holes aligned close to each other in a direction extending parallel to a moving direction of the ejected melt so that at least two jet flows of some or different semiconductor material are simultaneously ejected through the holes so as form a thin ribbon wafer or multi-layer type.

19. A method as defined in claim 1, wherein the raw semiconductor material is mixed with a substance selected from the group consisting of Ge, Si, Se, Te, PbS, InSb, ZnTe, PbSe, InAs, InP, GaSb, PbTe, ZnS, $Bi_2Te_3$ and mixtures thereof.

20. A method as defined in claim 1, wherein to the raw semiconductor material is added at least one additive substance selected from the group consisting of Sn, As, B, P, Sb, In, Al, Ga and alloy, intermetallic compound, conjugates thereof as an impurity.

21. A method as defined in claim 1, wherein to the raw semiconductor material is added a substance selected from the group consisting of B, P, BP, Sb and Al as a flux.

22. A method as defined in claim 21, wherein an amount of the added flux is selected to a value within the range of 0.01 to 50 atomic percentage.

23. A method as defined in claim 1 further comprising heating the thin ribbon wafer at a temperature within the range from 500° C. to a melting point for a time within the range of 0.1 second to a week in vacuum or an inert gas atmosphere.

24. A method as defined in claim 23, wherein the thin ribbon wafer is formed of silicon and is heated at about 1,100° C. for about 48 hours.

25. A method as defined in claim 1, wherein the raw semiconductor material is heated at a temperature within the range of from 100° C. to 150° C. above the melting point of the raw semiconductor material.

* * * * *